US011050012B2

United States Patent
Wang et al.

(10) Patent No.: US 11,050,012 B2
(45) Date of Patent: Jun. 29, 2021

(54) METHOD TO PROTECT ELECTRODES FROM OXIDATION IN A MEMS DEVICE

(71) Applicant: Taiwan Semiconductor Manufacturing Co., Ltd., Hsin-Chu (TW)

(72) Inventors: Yi-Ren Wang, Hsin-Chu (TW); Hung-Hua Lin, Taipei (TW); Yuan-Chih Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/371,421

(22) Filed: Apr. 1, 2019

(65) Prior Publication Data
US 2020/0313073 A1    Oct. 1, 2020

(51) Int. Cl.
| H01L 41/29 | (2013.01) |
| B81C 1/00 | (2006.01) |
| B81B 3/00 | (2006.01) |
| H01L 41/047 | (2006.01) |

(52) U.S. Cl.
CPC .......... *H01L 41/29* (2013.01); *B81B 3/0021* (2013.01); *B81C 1/00166* (2013.01); *B81C 1/00349* (2013.01); *H01L 41/047* (2013.01)

(58) Field of Classification Search
CPC ......... H01L 27/20; H01L 41/047–0477; H01L 41/29–297; H01L 41/332; B81B 3/0021; B81C 1/00166; B81C 1/00349
USPC ....................................................... 257/415
See application file for complete search history.

(56) References Cited

U.S. PATENT DOCUMENTS

| 2003/0077843 A1* | 4/2003 | Yamauchi | ......... H01L 21/32136 438/3 |
| 2004/0169253 A1* | 9/2004 | Springer | ........... H01L 21/76216 257/519 |
| 2007/0202626 A1 | 8/2007 | Liu | |
| 2009/0214801 A1* | 8/2009 | Higashi | ................. C23C 16/401 427/579 |
| 2011/0175215 A1* | 7/2011 | Farooq | .................. H01L 23/481 257/686 |
| 2016/0365504 A1* | 12/2016 | Suenaga | ................. H01L 41/29 |

(Continued)

OTHER PUBLICATIONS

SINTEF "About piezoMEMS." Published on Jan. 2, 2018. Retrieved online on Jan. 18, 2019 from https://www.sintef.no/projectweb/piezomems/about-piezomems/.

(Continued)

*Primary Examiner* — Mohammad M Hoque
(74) *Attorney, Agent, or Firm* — Eschweiler & Potashnik, LLC

(57) ABSTRACT

In some embodiments, the present disclosure relates to a method for forming a microelectromechanical system (MEMS) device, including depositing a first electrode layer over a first piezoelectric layer. A hard mask layer is then deposited over the first electrode layer. A photoresist mask is formed on the hard mask layer with a first-electrode pattern. Using the photoresist mask, a first etch is performed into the hard mask layer to transfer the first-electrode pattern to the hard mask layer. The photoresist mask is then removed. A second etch is performed using the hard mask layer to transfer the first-electrode pattern to the first electrode layer, and the hard mask layer is removed.

20 Claims, 14 Drawing Sheets

(56) References Cited

U.S. PATENT DOCUMENTS

2017/0301853 A1 10/2017 Xia et al.
2020/0176673 A1* 6/2020 Chung .................... H01L 43/12

OTHER PUBLICATIONS

Widder et al. "Basic Principles of MEMS Microphones." Published on May 14, 2014. Retrieved online on Jan. 27, 2019 from https://www.edn.com/design/analog/4430264/Basic-principles-of-MEMS-microphones-.

DuPont. "Removers for LED Fabrication." Published Feb. 2011.

Orbotech. "MEMS Microphones—What's All the Noise About?" The date of publication is unknown. Retrieved online on Jan. 18, 2019 from https://www.orbotech.com/spts/about/resources/tech-insights/mems-tech-insights/mems-microphones.

Wikipedia.org "Microelectromechanical Systems." Published on Nov. 14, 2018. Retrieved online on Jan. 24, 2019 from https://en.wikipedia.org/wiki/Microelectromechanical_systems.

Wikipedia.org "Piezoelectricity." Published on Jan. 21, 2019. Retrieved on Jan. 24, 2019 from https://en.wikipedia.org/wiki/Piezoelectricity.

SINTEF. "PiezoMEMS Production Process." Published on Apr. 26, 2010. Retrieved online on Jan. 18, 2019 from https://www.sintef.no/projectweb/piezomems/about-piezomems/process/.

Wikipedia.org. "Profilometer." Published on Dec. 6, 2018. Retrieved online on Feb. 5, 2019 from https://en.wikipedia.org/wiki/Profilometer.

"Ra & RMS Surface Roughness Calculation—Surface Finish Formulas—Harrison Electropolishing." The date of publication is unknown. Retrieved online on Feb. 5, 2019 from http://www.harrisonep.com/electropolishing-ra.html.

Wikipedia.org. "Sheet Resistance." Published on Oct. 16, 2016. Retrieved online on Jan. 27, 2019 from https://en.wikipedia.org/wiki/Sheet_resistance.

Berol, Dave. "The Advantages of Using Piezoelectric MEMS Microphones in Your Alexa-Enabled Product." Published on Sep. 20, 2017. Retrieved online on Jan. 10, 2019 from https://developer.amazon.com/blogs/alexa/post/bcef47f5-f1ca-4614-8a57-6af7eabfd1eb/the-advantages-of-using-piezoelectric-mems-microphones-in-your-alexa-enabled-product.

Schott Nexterion Glass B Microarray Slides are Manufactured From Borofloat. Published on Sep. 6, 2010. Retrieved online on Feb. 5, 2019 from https://www.slideshare.net/Nexterion/schott-nexterion-glass-bflatnessver02.

* cited by examiner

METHOD TO PROTECT ELECTRODES FROM OXIDATION IN A MEMS DEVICE

BACKGROUND

Microelectromechanical systems (MEMS) microphones are becoming increasingly common in modern day sound-activated devices (e.g., smart speakers, hearing aids, and microphones). MEMS microphones sense the presence of sound waves and convert them into an electrical signal for processing. PiezoMEMS microphones utilize a piezoelectric structure that converts mechanical strain into an electrical signal. PiezoMEMS microphones are promising candidates for the next generation of MEMS microphones as piezoMEMS microphones provide a high signal to noise ratio and are insensitive to particles and moisture compared to other types of MEMS microphones.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
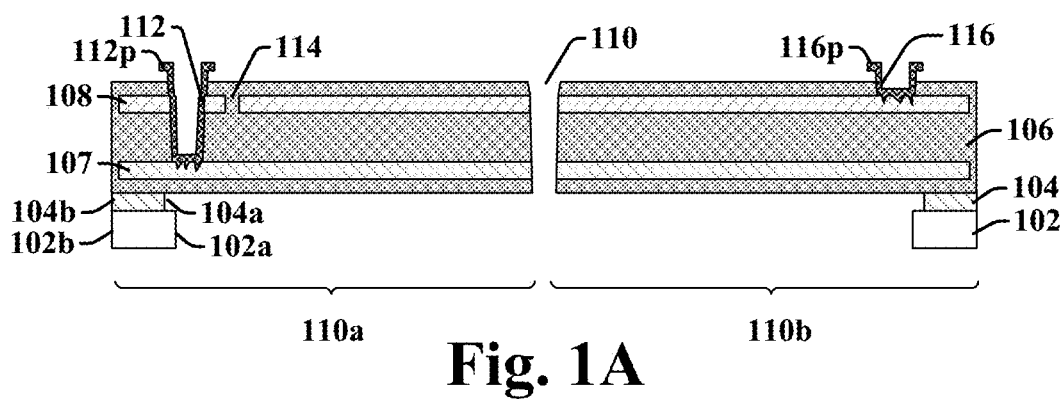
FIGS. 1A and 1B illustrate cross-sectional views of various embodiments of a piezomicroelectromechanical system (piezoMEMS) microphone having multiple patterned electrode layers with substantially uniform sheet resistances throughout their lengths.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A piezo-microelectromechanical system (piezoMEMS) microphone may, for example, include a first electrode layer, a second electrode layer, and a piezoelectric structure. The first and second electrode layers are embedded in the piezoelectric structure, and the second electrode layer overlies and is spaced from the first electrode layer. The piezoelectric structure and the first and second electrode layers at least partially define a first plate and a second plate. The first and second plates are separated by a center cavity and are supported at a periphery of the piezoMEMS microphone to allow the first and second plates to deflect in response to sound waves. The deflection creates an electrical signal in the piezoelectric structure that represents the extent of the deflection and that can be sensed at the first and second electrode layers.

A method for forming the piezoMEMS microphone may, for example, comprise depositing a first electrode layer on a first piezoelectric layer and forming a photoresist mask with a first electrode pattern on the first electrode layer. An etch is performed into the first electrode layer with the photoresist mask in place to transfer the first electrode pattern to the first electrode layer and the photoresist mask is removed. Removal of the photoresist mask may, for example, be performed by oxygen plasma ashing. However, the oxygen plasma ashing oxidizes the first electrode layer, and hence partially consumes the first electrode layer, along a top surface of the first electrode layer. This increases top-surface roughness of the first electrode layer and leads to non-uniformity in the thickness of the first electrode layer. The increased top-surface roughness may, for example, diminish the effectiveness of the piezoelectric effect, whereby the piezoMEMS microphone may be less sensitive to sound waves. For example, the crystal structure of a second piezoelectric layer may be negatively impacted when deposited over the first electrode layer having an increased top-surface roughness. Thus, the non-uniform thickness may, for example, lead to non-uniformity in operating parameters of the piezoMEMS microphone during bulk manufacturing and may hence lead to low yields.

Various embodiments of the present disclosure provide a method of manufacturing patterned electrode layers to produce reliable piezoMEMS microphones and/or other piezoelectric MEMS devices. In some embodiments, the new method includes depositing a barrier layer on an electrode layer and subsequently forming a photoresist mask on the barrier layer. A first etch is performed into the barrier layer with the photoresist mask in place and the photoresist mask is stripped. The photoresist mask may, for example, be stripped by oxygen-based plasma ashing. With the photoresist mask stripped, a second etch is performed into the electrode layer with the barrier layer in place and the barrier layer is subsequently removed.

The barrier layer may, for example, serve as an oxygen barrier to prevent oxidation of the electrode layer during patterning of the electrode layer. Hence, the barrier layer may, for example, prevent oxidation of the electrode layer during the oxygen-based plasma ashing to remove the photoresist mask. By preventing oxidation of the electrode layer, the electrode layer has a substantially uniform thickness throughout, a low surface roughness, and a substantially uniform sheet resistance. This, in turn, enhances the piezoelectric effect of the piezoMEMS device, which may, for example, lead to enhanced sensitivity when the piezoMEMS device is a microphone or some other suitable sensor.

FIG. 1A illustrates a cross-sectional view 100A of some embodiments of a piezoMEMS microphone comprising multiple patterned electrode layers.

The cross-sectional view 100 of the piezoMEMS microphone includes a first electrode layer 107 and a second electrode layer 108 embedded in a piezoelectric structure 106. The first electrode layer 107 is vertically spaced apart from the second electrode layer 108 by the piezoelectric structure 106. In some embodiments, the first electrode layer 107 and the second electrode layer 108 both have a surface roughness of their top surface that is less than the surface roughness of at least one their sidewalls. The piezoelectric structure 106 is supported by a substrate 102. The substrate 102 supports peripheral portions of the piezoelectric structure 106. The substrate 102 has a pair of inner sidewalls 102a and a pair of outer sidewalls 102b. In some embodiments, a front side dielectric layer 104 is disposed between the substrate 102 and the piezoelectric structure 106. The front side dielectric layer 104 has a pair of inner sidewalls 104a and a pair of outer sidewalls 104b. In some embodiments, the pair of inner sidewalls 104a of the front side dielectric layer 104 are laterally offset from the pair of inner sidewalls 102a of the substrate 102.

In a center portion of the piezoelectric structure 106, a cavity 110 extends from a top surface of the piezoelectric structure 106 to a bottom surface of the piezoelectric structure 106. The cavity 110 also extends through the first electrode layer 107 and the second electrode layer 108. In some embodiments, the cavity 110 has tapered sidewalls. On a first side 110a of the cavity 110, in some embodiments, is a first contact 112. The first contact 112 may, for example, extend from the top surface of the piezoelectric structure 106 to a top surface of the first electrode layer 107, thereby extending through the second electrode layer 108. In some embodiments, the top surface of the first electrode layer 107 that contacts the first contact 112 may have a higher surface roughness than other top surfaces of the first electrode layer 107 that contact the piezoelectric structure 106. On a second side 110b of the cavity 110, in some embodiments, is a second contact 116. In other embodiments, the second contact 116 is on the first side 110a of the cavity 110. The second contact 116 may, for example, extend from the top surface of the piezoelectric structures 106 to a top surface of the second electrode layer 108. In some embodiments, the top surface of the second electrode layer 108 that contacts the second contact 116 may have a higher surface roughness than other top surfaces of the second electrode layer 108 that contact the piezoelectric structure 106. The first contact 112 and the second contact 116 may, in some embodiments, have respective peripheral portions 112p and 116p that overhang and are spaced from the top surface of the piezoelectric structure 106.

In some embodiments, because the first contact 112 is electrically coupled to the second electrode layer 108, and the second contact 116 is electrically coupled to the second electrode layer 108, a discontinuity 114 may be present within the second electrode layer 108 in order to electrically isolate the first contact 112 from the second contact 116. In some embodiments, the discontinuity 114 is located closer to the first contact 112 than the second contact 116. In some embodiments, the discontinuity 114 is on an opposite side of the cavity 110 than the second contact 116.

In some embodiments, the first electrode layer 107 and the second electrode layer 108 each have a substantially low surface roughness and hence a substantially uniform thickness. This, in turn, leads to a more uniform crystalline lattice in the piezoelectric structure 106 and hence enhances the piezoelectric effect used by the piezoMEMS microphone to sense sound waves, such that piezoMEMS microphone has enhanced sensitivity to sound waves. As seen hereafter, the low surface roughness and the uniform thickness may, for example, be due to patterning of the first and second electrodes 107, 108 using a barrier layer that prevents top-surface oxidation of the first and second electrodes 107, 108.

Figure 1B:
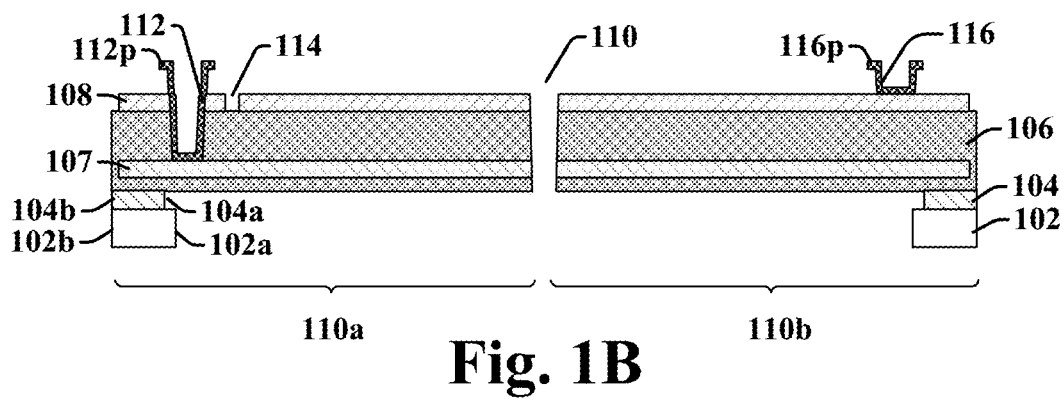

FIG. 1B illustrates a cross-sectional view 100B of some alternative embodiments of the piezoMEMS microphone of FIG. 1A in which a top portion of the piezoelectric structure 106 is omitted. As such, the second electrode layer 108 is exposed.

Figure 2:
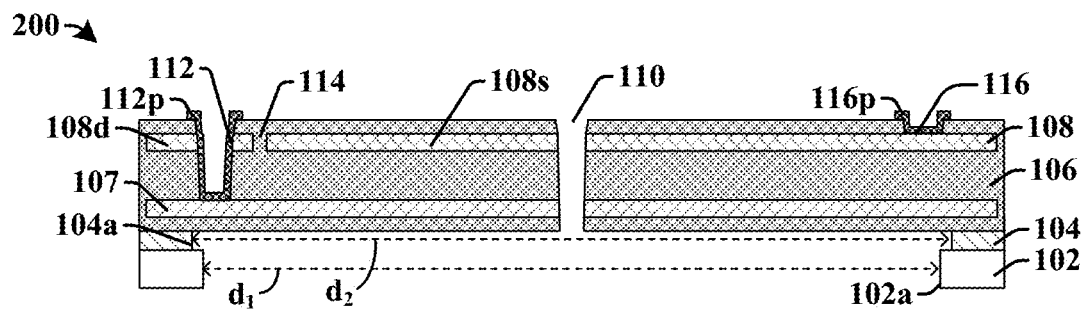
FIG. 2 illustrates a cross-sectional view of some alternative embodiments of the piezoMEMS microphone of FIG. 1A in which contacts directly contact top surfaces of a piezoelectric structure.

FIG. 2 illustrates a cross-sectional view 200 of some additional embodiments of a piezoMEMS microphone comprising multiple patterned electrode layers.

The cross-sectional view 200 of the piezoMEMS microphone includes the same features as the piezoMEMS microphone in the cross-sectional view 100 of FIG. 1A. However, in the cross-sectional view 200, the piezoMEMS microphone has first and second contacts 112, 116 with different characteristics. In some embodiments, due to different manufacturing sequences, the first contact 112 may have peripheral portions 112p that directly contact the top surface of the piezoelectric structure 106. Similarly, in some embodiments, the second contact 116 may have peripheral portions 116p that directly contact the top surface of the piezoelectric structure 106. The discontinuity 114 electrically isolates the first contact 112 from the second contact 116. The discontinuity 114 in the second electrode layer 108 separates the second electrode layer 108 into a sensing segment 108s that is sensed by the second contact 116 and a dummy segment 108d that is in contact with the first contact 112. In some embodiments, the dummy segment 108d does not provide electrical information to the first contact 112. In some embodiments, the sensing segment 108s is longer than the dummy segment 108d.

In some embodiments, the pair of inner sidewalls 102a of the substrate 102 may be spaced apart by a first distance $d_1$. Additionally, the pair of inner sidewalls 104a of the front side dielectric layer 104 may be spaced apart by a second distance $d_2$. In some embodiments, the second distance $d_2$ is larger than the first distance $d_1$.

In some embodiments, the first electrode layer 107 and the second electrode layer 108 each have a substantially low surface roughness and hence a substantially uniform thickness. In some embodiments, surface roughness may be quantified by measuring the average surface roughness. In some embodiments, to measure average surface roughness, a roughness measurement tool (e.g., a profilometer, AFM) calculates a mean line along a surface and measures the deviation between the height of a peak or valley on the surface from the mean line. After measuring many deviations at many peaks and valleys throughout the surface, the average surface roughness is calculated by taking the mean of the many deviations, where the deviations are absolute values. In other embodiments, the surface roughness is quantified by measuring a total thickness variation (TTV). The TTV of a layer is the difference between the smallest thickness and the largest thickness of the layer. The TTV is measured throughout the length of a layer.

In some embodiments, the top surface of the first electrode layer 107 and the top surface of the second electrode layer 108 each have an average surface roughness of less than approximately 1 nanometer. Similarly, in some embodiments, the first electrode layer 107 and the second electrode layer 108 may each have a TTV of less than approximately 1 nanometer. Other values are, however, amenable for the average surface roughness and the TTV. In some embodiments, the first electrode layer 107 and the second electrode layer 108 both have an average surface roughness of their top surface that is less than the average surface roughness of their outermost sidewalls. Thus, in some embodiments, outermost sidewalls of the first electrode layer 107 and outermost sidewalls of the second electrode layer 108 may each have an average surface roughness and/or TTV of greater than approximately 1 nanometer. The average surface roughness and TTV of the first electrode layer 107 and the second electrode layer 108 may be influenced, in some embodiments, by the patterning sequences of the first and second electrode layers 107, 108. Because the top surfaces of the first and second electrode layers 107, 108 have a low average surface roughness and/or a low TTV, the sheet resistances of the first and second electrode layers 107, 108 are each substantially uniform. In some embodiments, the sheet resistance of the first electrode layer 107 and the sheet resistance of the second electrode layer 108 are each in a range of between approximately 1 Ohm per square and approximately 20 Ohms per square. Other values are, however, amenable.

Figure 3:
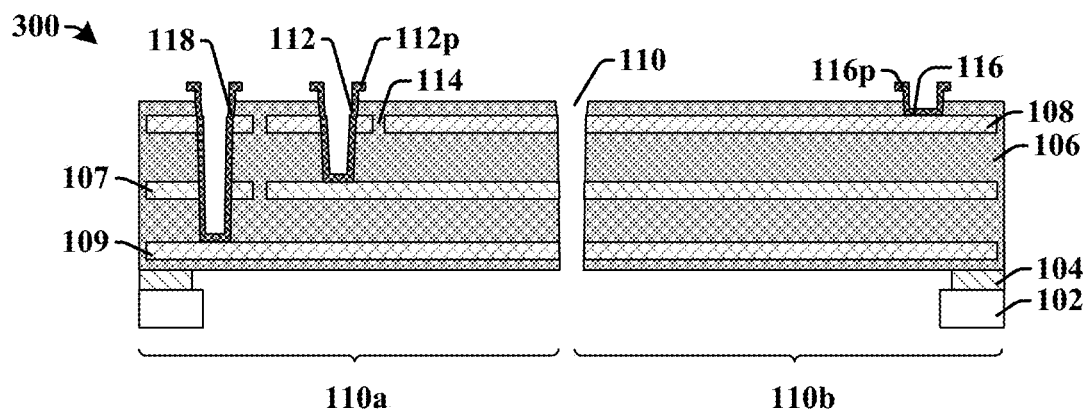
FIG. 3 illustrates a cross-sectional view of some alternative embodiments of a piezoMEMS microphone having a plurality of patterned electrode layers with substantially uniform sheet resistances throughout their lengths.

FIG. 3 illustrates a cross-sectional view 300 of some embodiments of a piezoMEMS microphone comprising a plurality of patterned electrode layers.

The cross-sectional view 300 of the piezoMEMS microphone includes the same features as the piezoMEMS microphone in the cross-sectional view 100, with the addition of a third electrode layer 109 and a third contact 118. In some embodiments, as illustrated, a piezoMEMS microphone includes the third electrode layer 109 in addition to the first and second electrode layers 107, 108. In other embodiments, a piezoMEMS microphone includes more than three electrode layers. In some embodiments, the number of contacts is equal to the number of electrode layers. The third electrode layer 109, in some embodiments, is below the first electrode layer 107 and is vertically spaced from the first electrode layer 107 by the piezoelectric structure 106. In some embodiments, the third contact 118 extends from the top surface of the piezoelectric structure 106 to a top surface of the third electrode layer 109. The third contact 118 extends completely through the first electrode layer 107 and the second electrode layer 108. In some embodiments, the first contact 112 and the third contact 118 are on the first side 110a of the cavity 110, whereas the second contact 116 is on the second side 110b of the cavity 110. In some embodiments, the third contact 118 directly contacts the first electrode layer 107, the second electrode layer 108 and the third electrode layer 109. The first contact 112, in some embodiments, directly contacts the first electrode layer 107 and the second electrode layer 108. To electrically isolate the first contact 112, the second contact 116, and the third contact 118, discontinuities 114 are formed within the first electrode layer 107 and the second electrode layer 108.

Figure 4:
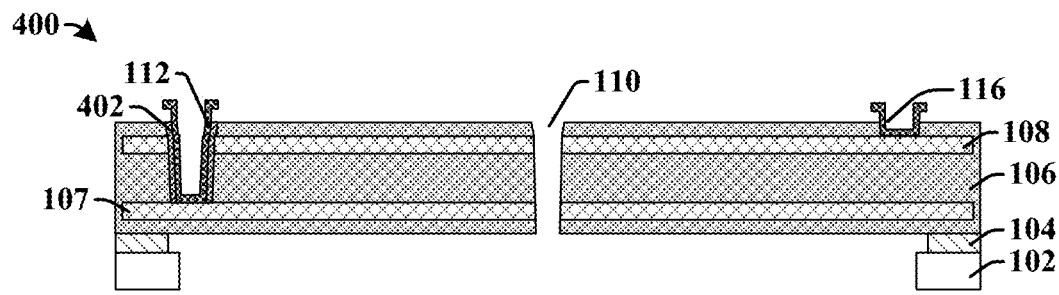
FIG. 4 illustrates a cross-sectional view of some embodiments of a piezoMEMS microphone having a contact partially surrounded by a dielectric lining.

FIG. 4 illustrates a cross-sectional view 400 of some additional embodiments of a piezoMEMS microphone comprising multiple patterned electrode layers.

The cross-sectional view 400 of the piezoMEMS microphone includes similar features as the piezoMEMS microphone in the cross-sectional view 100A of FIG. 1A. However, the embodiments in the cross-sectional view 400 of FIG. 4 utilize a dielectric liner 402 instead of the discontinuity 114 of FIG. 1A to electrically isolate the first contact 112 from the second electrode layer 108. In some embodiments, the dielectric liner 402 extends along outer sidewalls of the first contact 112. The dielectric liner 402 separates the first contact 112 from the second electrode layer 108 and also separates the outer sidewalls of the first contact 112 from the piezoelectric structure 106. In some embodiments, bottom surfaces of the dielectric liner 402 directly contact the first electrode layer 107. The bottom surface of the first contact 112 still directly contacts the top surface of the first electrode layer 107. In some embodiments, the second contact 116 does not contact the dielectric liner 402. In other embodiments, the dielectric liner 402 also extends along outer sidewalls of the second contact 116, separating outer sidewalls of the second contact 116 from the piezoelectric structure 106. Further, in some embodiments, the first electrode layer 107 and the second electrode layer 108 have outermost sidewalls that are spaced apart from outermost sidewalls of the piezoelectric structure 106. In other embodiments, the first electrode layer 107 and the second electrode layer 108 have outermost sidewalls that are substantially coplanar with the outermost sidewalls of the piezoelectric structure 106.

Figure 5:
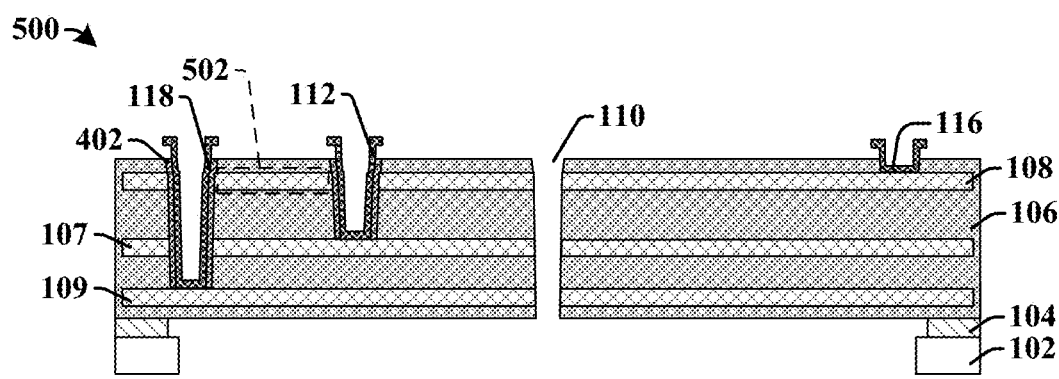
FIG. 5 illustrates a cross-sectional view of some alternative embodiments of a piezoMEMS microphone having three contacts, at least two of which being surrounded by a dielectric lining.

FIG. 5 illustrates a cross-sectional view 500 of some additional embodiments of a piezoMEMS microphone comprising a plurality of patterned electrode layers.

The cross-sectional view 500 of the piezoMEMS microphone includes similar features as the piezoMEMS microphone in the cross-sectional view 400 of FIG. 4, with the addition of a third electrode layer 109 and a third contact 118. The third contact 118 extends from a top surface of the piezoelectric structure 106 to a top surface of the third electrode layer 109. The third contact 118 directly contacts the third electrode layer 109. In some embodiments, the dielectric liner 402 also extends along outer sidewalls of the third contact 118, separating outer sidewalls of the third contact 118 from the piezoelectric structure 106, the first electrode layer 107 and the second electrode layer 108. In some embodiments, the first electrode layer 107, the second electrode layer 108, and the third electrode layer 109 do not contain discontinuities (e.g., 114 of FIGS. 1-3). For example, in some embodiments, a portion of the second electrode layer 502 continuously extends between the first contact 112 and the third contact 118. In some embodiments, the dielectric liner 402 separates the portion of the second electrode layer 502 from the first contact 112 and the third contact 118, whereas the second contact 116 directly contacts the second electrode layer 108.

Figure 6A:
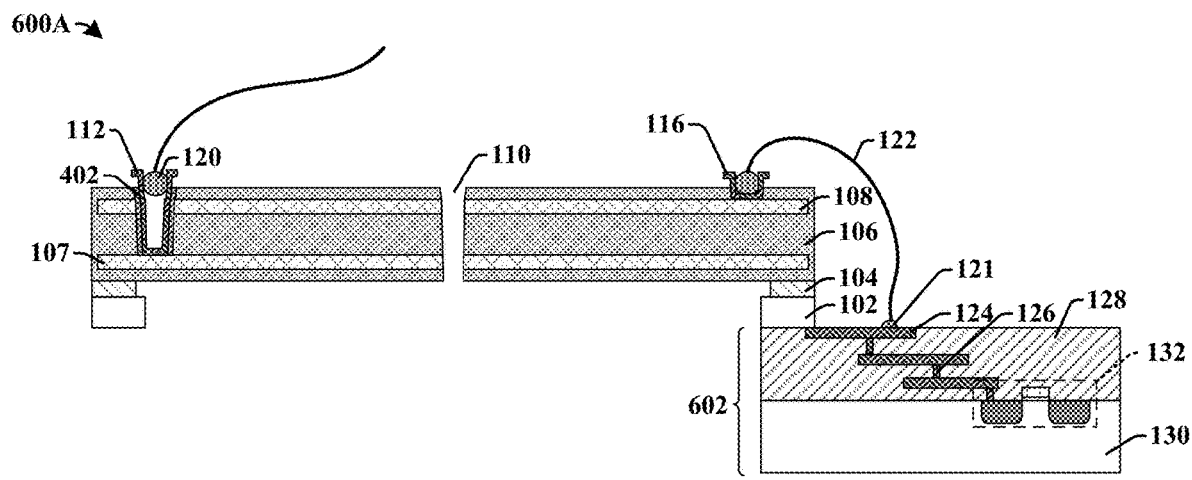
FIGS. 6A and 6B illustrate various views of some embodiments of a piezoMEMS microphone coupled to a transistor.

FIG. 6A illustrates a cross-sectional view 600A of some embodiments of a piezoMEMS microphone coupled to a transistor in an integrated chip (IC) chip 602.

The cross-sectional view 600A of the piezoMEMS microphone includes the same features as the piezoMEMS microphone in the cross-sectional view 400, with additional features to couple the piezoMEMS microphone to a transistor 132. The transistor 132 is disposed on and within a substrate 130. The transistor 132 may, for example, be a metal oxide semiconductor field-effect transistor (MOSFET) and/or may, for example, comprise a source and a drain within the substrate 130 as well as a gate electrode above a gate oxide on the substrate 130 and between the source and drain. Above the substrate 130 is a dielectric structure 128, where interconnect vias 126 and interconnect wires 124 are embedded. In some embodiments, at least a portion of the substrate 102 that supports the piezoelectric structure 106 rests on the dielectric structure 128. The interconnect wires 124 and the interconnect vias 126 are coupled to the source of the transistor 132 or the drain of the transistor 132. In some embodiments, a conductive bump 121 is coupled to one of the interconnect wires 124 and is above the dielectric structure 128. In some embodiments, solder bumps 120 are coupled to the first contact 112 and the second contact 116. In some embodiments, the solder bump 120 does not contact a bottom inner surface of the first contact 112. Similarly, in some embodiments, as shown at the second contact 116, the solder bump 120 contacts a bottom inner surface of the second contact 116 and inner sidewalls of the second contact 116. In some embodiments, a conductive wire 122 connects the solder bump 120 to the conductive bump 121.

Figure 6B:
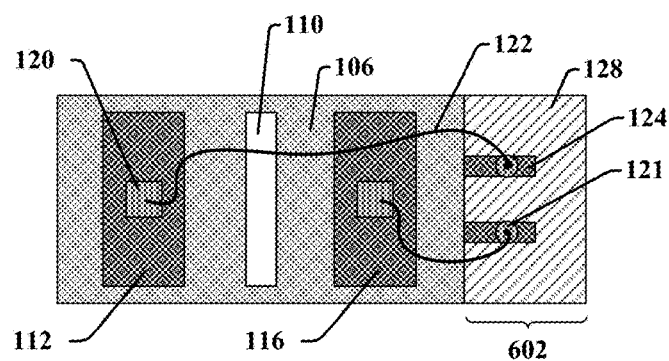

FIG. 6B illustrates a top view 600B of some embodiments of a piezoMEMS microphone coupled to a transistor.

The top view 600B of FIG. 6B may be from the same embodiment of the piezoMEMS microphone as the cross-sectional view 600A of FIG. 6A. As seen in the top view 600B, in some embodiments, the cavity 110 does not completely separate the piezoelectric structure 106. In some embodiments, the first contact 112 and the second contact 116 may be rectangular shaped, and the solder bumps 120 may be substantially centered in the first contact 112 and the second contact 116, from a top-view perspective. The first contact 112 and the second contact 116 are each coupled to one of the interconnect wires 124, which may be coupled to more than one transistor 132 in the IC chip 602 of FIG. 6A.

Figure 7:
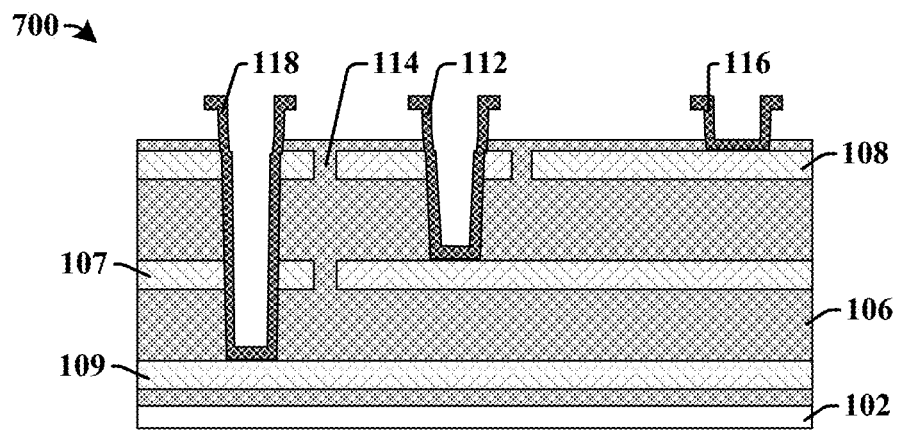
FIGS. 7-8 illustrate cross-sectional views of some embodiments of a piezoelectric device having a plurality of patterned electrode layers with substantially uniform sheet resistances throughout their lengths.

FIG. 7 illustrates a cross-sectional view 700 of some embodiments of a piezoelectric device having a plurality of patterned electrode layers.

The cross-sectional view 700 includes some of the same features as the cross-sectional view 300 of FIG. 3. In some embodiments, the cross-sectional view 700 may, for example, be part of a piezoelectric sensor, a piezoelectric actuator, or some other suitable piezoelectric device. The piezoelectric device of the cross-sectional view 700 includes a piezoelectric structure 106 supported by a substrate 102. In some embodiments, the piezoelectric structure 106 directly contacts the substrate 102. In some embodiments, the cross-sectional view 700 includes a first electrode layer 107, a second electrode layer 108, and a third electrode layer 109. In other embodiments, more or less than three electrode layers may be used. Discontinuities 114 electrically isolate the first contact 112, the second contact 116, and the third contact 118 from one another. In some embodiments, the third electrode layer 109, which is a bottommost electrode layer in the cross-sectional view 700, is free of discontinuities 114. In some embodiments, the first electrode layer 107, the second electrode layer 108, and the third electrode layer 109 have substantially equal sheet resistances and/or each has a substantially uniform sheet resistance throughout its length. As seen hereafter, this may, for example, be due to use of a barrier/hard mask layer while patterning the electrode layers.

Figure 8:
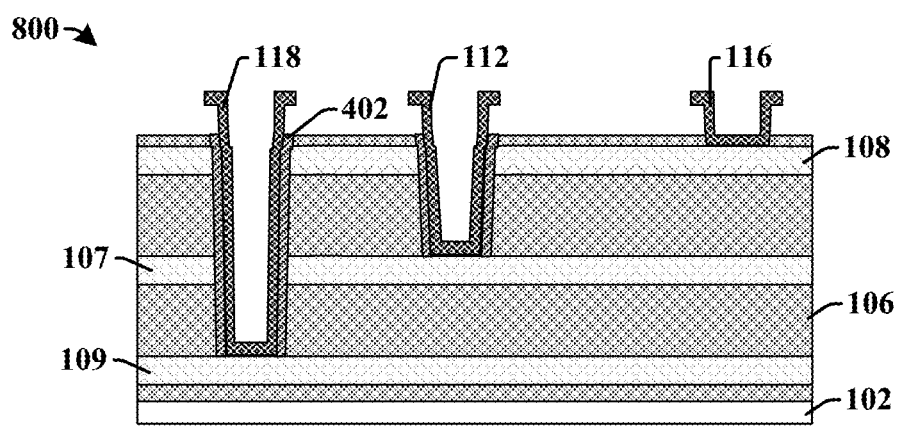

FIG. 8 illustrates a cross-sectional view 800 of some additional embodiments of a piezoelectric device having a plurality of patterned electrode layers.

The cross-sectional view 800 includes similar features as the cross-sectional view 700, except instead of including the discontinuities 114 of FIG. 7, the cross-sectional view 800 includes a dielectric liner 402 to provide electrical isolation between the first contact 112, the second contact 116, and the third contact 118. In some embodiments, the dielectric liner 402 extends along outermost sidewalls of the first contact 112 and the third contact 118. In other embodiments, the dielectric liner 402 also extends along outermost sidewalls of the second contact 116.

While FIGS. 2-5, 6A, 6B, 7, and 8 illustrate the second electrode layer 108 as being covered by the piezoelectric structure 106, a top portion of the piezoelectric structure 106 may alternatively be omitted in any one or combination of FIGS. 2-5, 6A, 6B, 7, and 8 so the second electrode layer 108 is uncovered. An example of this may, for example, be seen through comparison of FIG. 1A to FIG. 1B.

FIGS. 9-29 illustrate cross-sectional views 900-2800 of some embodiments of a method of forming a piezoMEMS microphone. Although FIGS. 9-28 are described in relation to a method, it will be appreciated that the structures disclosed in FIGS. 9-28 are not limited to such a method, but instead may stand alone as structures independent of the method.

Figure 9:
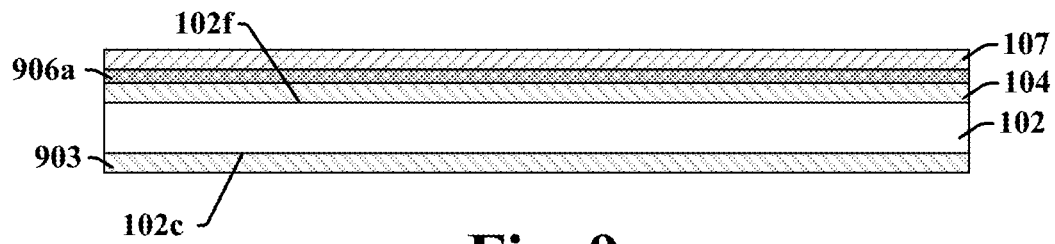
FIGS. 9-29 illustrate cross-sectional views of some embodiments of a method of forming a piezoMEMS microphone with electrodes having low average surface roughnesses.

As shown in the cross-sectional view 900 of FIG. 9, a substrate 102 is provided. In various embodiments, the substrate 102 may be or comprise a bulk substrate (e.g., a bulk silicon substrate), monocrystalline silicon, P doped silicon, N doped silicon, or the like. A front side dielectric layer 104 is disposed on a front side 102f of the substrate 102. In some embodiments, a backside dielectric layer 903 is disposed on a backside 102c of the substrate 102. The front side dielectric layer 104 and the backside dielectric layer 903, in some embodiments, comprise a same dielectric material (e.g., an oxide, nitride, carbide, or the like). A first piezoelectric layer 906a is deposited over the front side dielectric layer 104. In some embodiments, the first piezoelectric layer 906a comprises a piezoelectric material such as aluminum nitride, zinc oxide, or the like. The thickness of the first piezoelectric layer 906a, in some embodiments, may be in a range of between approximately 5 nanometers and approximately 50 nanometers.

A first electrode layer 107 is disposed over the first piezoelectric layer 906a. In some embodiments, the first piezoelectric layer 906a and the first electrode layer 107 are deposited using the same process tool, where the substrate 102 remains in the process tool at least from the depositing of the first piezoelectric layer 906a until after the depositing of the first electrode layer 107. In various embodiments, the first electrode layer 107 may comprise a conductive material such as molybdenum, nickel, or the like. The thickness of the first electrode layer 107, in some embodiments, may be in a range of between approximately 10 nanometers and approximately 100 nanometers. In some embodiments, the first electrode layer 107 has a first surface roughness that is substantially low, which may be quantified by an average surface roughness and/or a total thickness variation of less than approximately 1 nanometer, in some embodiments. Oftentimes, the actual average surface roughness changes depending on the thickness of the first electrode layer 107. The first electrode layer 107 may also have a substantially uniform sheet resistance in a range of between approximately 1 Ohm per square and approximately 20 Ohms per square, in some embodiments. The substantially uniform sheet resistance is due to a uniform thickness from the substantially low surface roughness.

Figure 10:
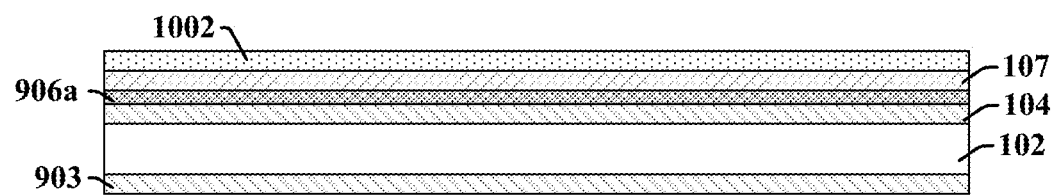

As shown in the cross-sectional view 1000 of FIG. 10, a hard mask layer 1002 is deposited over the first electrode layer 107. The hard mask layer 1002 serves as a barrier to prevent oxidation of the first electrode layer 107 during subsequent processing. In some embodiments, the hard mask layer 1002 comprises silicon dioxide, silicon nitride, silicon oxynitride, or other dielectric-like materials. The hard mask layer 1002 is deposited using a pulsed direct current (DC) sputtering or some other suitable physical vapor deposition (PVD) process, in some embodiments. The PVD process allows deposition of the hard mask layer 1002 without, or with minimal, oxidation of the first electrode layer 107, and hence allows the thickness of the hard mask layer 1002 to be controlled, since oxidation is somewhat uncontrollable. Without oxidizing the first electrode layer 107, the surface roughness of the first electrode layer 107 remains substantially unchanged. Using chemical vapor deposition (CVD) for depositing the hard mask layer 1002 may, for example, lead to top surface oxidation of the first electrode layer 107 and may hence prevent control over a thickness of the hard mask layer 1002. When the thickness of the hard mask layer 1002 is controllable, removal of the hard mask layer 1002 is also more controllable, which is conducted between FIGS. 15 and 16 hereinafter. In some embodiments, the PVD of the hard mask layer 1002 is conducted in a same process tool as the deposition of the first electrode layer 107 to prevent oxidation of the first electrode layer 107. For example, the first electrode layer 107 is deposited in a first process chamber of a process tool and the hard mask layer 1002 is subsequently deposited in a second process chamber of the process tool, wherein the first electrode layer 107 is not removed from the process tool until after the deposing of the hard mask layer 1002.

In some embodiments, the hard mask layer 1002 may have a thickness in a range of between approximately 1 nanometer and approximately 20 nanometers. If the thickness of the hard mask layer 1002 is too low (e.g., less than about 1 nanometer or some other suitable value), the hard mask layer 1002 may unable to serve as an oxidation barrier to the first electrode layer 107. If the thickness of the hard mask layer 1002 is too high (e.g., greater than about 20 nanometers or some other suitable value), material may be wasted on the hard mask layer 1002 and time may be wasted upon removal of the hard mask layer 1002. The hard mask layer 1002 completely covers top surfaces of the first electrode layer 107.

Figure 11:
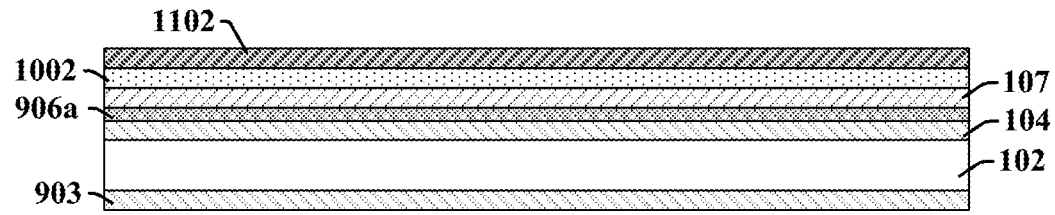

As shown in the cross-sectional view 1100 of FIG. 11, a photoresist layer 1102 is deposited over the hard mask layer 1002. In some embodiments, the photoresist layer 1102 is a photosensitive material that may, for example, be formed by a spin coating process. The photoresist layer 1102 completely covers top surfaces of the hard mask layer 1002.

Figure 12:
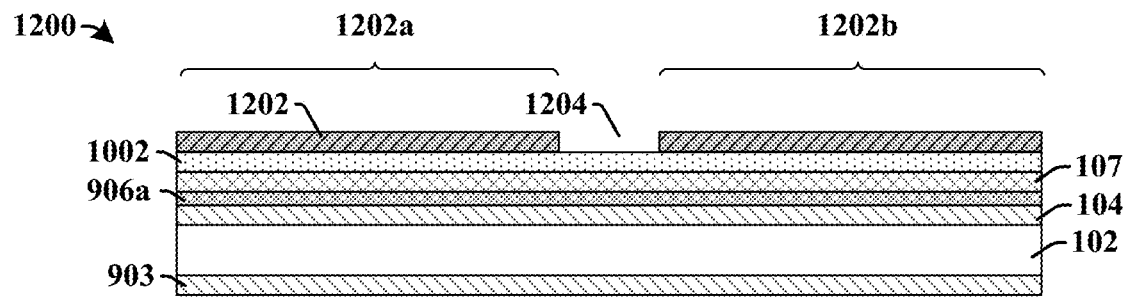

As shown in the cross-sectional view 1200 of FIG. 12, the photoresist layer 1102 of FIG. 11 is patterned to form a patterned photoresist layer 1202. The patterned photoresist layer 1202 is formed using photolithography and an etching process (e.g., wet etch or dry etch). The patterned photoresist layer 1202 defines at least an opening 1204 to expose the hard mask layer 1002. The patterned photoresist layer 1202 comprises a pattern to be transferred to the first electrode layer 107. In some embodiments, the opening 1204 in the patterned photoresist layer 1202 may have a width in a range of approximately 1 micrometer and approximately 5 micrometers. The patterned photoresist layer 1202 has a first side 1202a on one side of the opening 1204, and a second side 1202b on another side of the opening 1204. The first side 1202a and the second side 1202b of the patterned photoresist layer 1202 may, for example, have substantially equal widths. In some embodiments, the first side 1202a and the second side 1202b of the patterned photoresist layer 1202 may each have a width in a range of between approximately 300 micrometers and approximately 600 micrometers.

Figure 13:
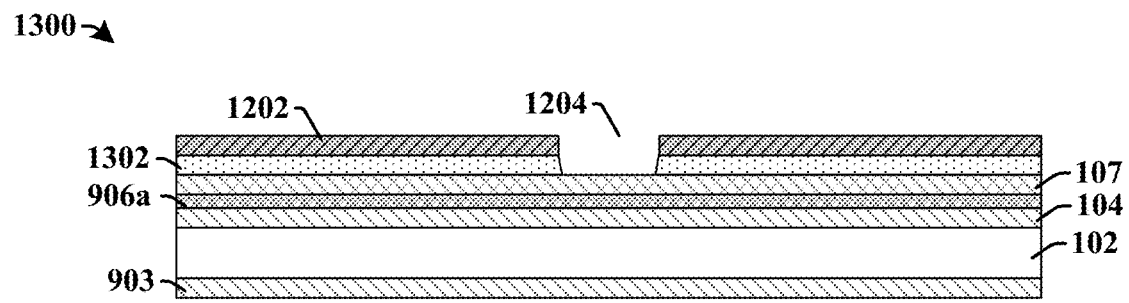

As shown in the cross-sectional view 1300 of FIG. 13, the hard mask layer 1002 of FIG. 12 is patterned to form a patterned hard mask layer 1302. The patterned hard mask layer 1302 may be formed by etching (e.g., wet etch or dry etch) using the patterned photoresist layer 1202 as a mask. Thus, the patterned hard mask layer 1302 and the patterned photoresist layer 1202 both share the same pattern having at least the opening 1204, in some embodiments. The inner sidewalls of the patterned hard mask layer 1302 that define the opening 1204 may be tapered or angled due to etching effects.

Figure 14:
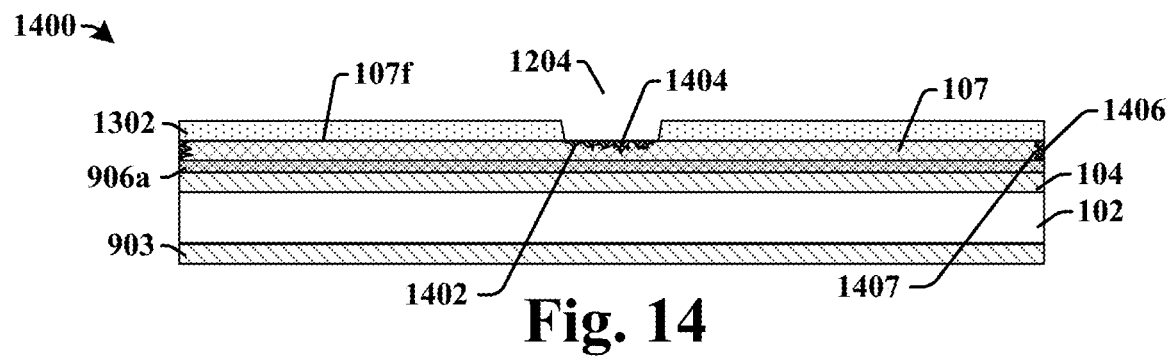

As shown in the cross-sectional view 1400 of FIG. 14, the patterned photoresist layer 1202 of FIG. 13 is stripped. In some embodiments, the patterned photoresist 1202 of FIG. 13 is stripped using oxygen plasma ashing and a solvent (e.g., EKC). In some embodiments, exposed portions of the first electrode layer 107 become oxidized due to their exposure to the oxygen plasma ashing. Thus, after the stripping of the patterned photoresist layer 1202 of FIG. 13, in some embodiments, the first electrode layer 107 has an oxidized top layer 1404 on an exposed top surface portion 1402 within the opening 1204 and oxidized side layers 1406 on outermost sidewalls 1407 of the first electrode layer 107. Protected top surface portions 107f of the first electrode layer 107 that are covered by the patterned hard mask layer 1302 do not oxidize because they are protected by the patterned hard mask layer 1302. Due to oxidation of exposed portions of the first electrode layer 107 after removal of the patterned photoresist 1202, the exposed top surface portion 1402 may have a surface roughness that is greater than the surface roughness of the protected top surface portions 107f of the first electrode layer 107. In some embodiments, the outermost sidewalls 1407 of the first electrode layer 107 also have a surface roughness that is greater than the surface roughness of the protected top surface portions 107f of the first electrode layer 107. As above, the surface roughness may, for example, be quantified by average surface roughness and/or TTV. In some embodiments, the surface roughnesses of the exposed top surface portion 1402 and of the outermost sidewalls 1407 may each be in a range of between approximately 2 times to approximately 7 times the surface roughness of the protected top surface portions 107f of the first electrode layer 107.

Figure 15:
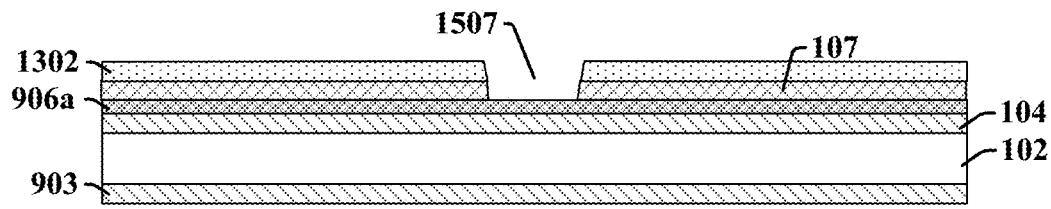

As shown in the cross-sectional view 1500 of FIG. 15, the first electrode layer 107 of FIG. 14 is patterned. Note that the oxidized side layers 1406 of FIG. 14 are omitted to illustrate some alternative embodiments The first electrode layer 107 is patterned by etching (e.g., wet etch or dry etch) using the patterned hard mask layer 1302 as a mask. The etching forms an opening 1507 within the first electrode layer 107, thereby removing the oxidized top layer 1404 of FIG. 14 and the exposed top surface portion 1402 of the first electrode layer 107 of FIG. 14. The opening 1507 within the first electrode layer 107 extends through the first electrode layer 107 to expose a portion of the first piezoelectric layer 906a. The first electrode layer 107 shares the same pattern as the patterned photoresist layer 1202 of FIG. 12.

Figure 16:
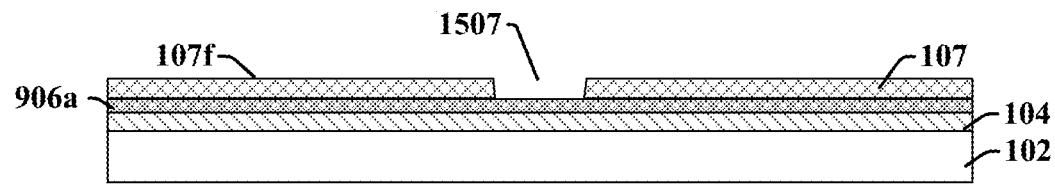

As shown in the cross-sectional view 1600 of FIG. 16, the patterned hard mask layer 1302 and the backside dielectric layer 903 of FIG. 15 are removed. In some embodiments, the patterned hard mask layer 1302 is removed by an Ar-sputter process. In some embodiments, because the patterned hard mask layer 1302 had a thickness controllable by the PVD process, the Ar-sputter process used may also be well controlled, thereby mitigating the impact the Ar-sputter process has on the surface roughness of the protected top surface portions 107f of the first electrode layer 107. In some embodiments, after the removal, the protected top surface portions 107f of the first electrode layer 107 has a surface roughness that may be quantified by an average surface roughness that is approximately less than 1 nanometer. In some embodiments (not shown), the Ar-sputter process also removes the oxidized side layers 1406 of FIG. 14 on the outermost sidewalls 1407 of the first electrode layer 107. In some embodiments (not shown), some of the oxidized side layers 1406 of FIG. 14 remain on the outermost sidewalls 1407 of the first electrode layer 107. In some embodiments, the surface roughness of the protected top surface portions 107f of first electrode layer 107 is substantially less than that at the outermost sidewalls 1407 of the first electrode layer 107.

Figure 17:
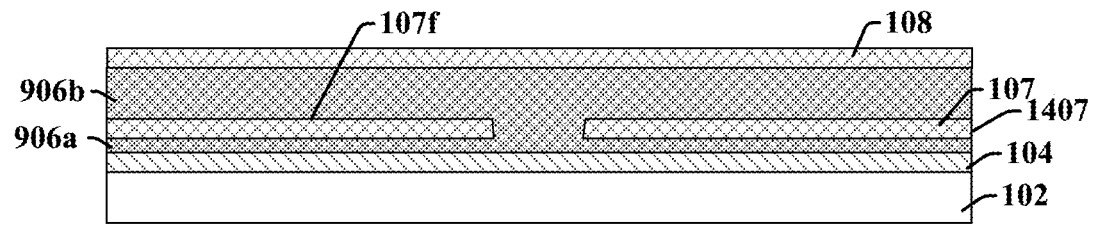

As shown in the cross-sectional view 1700 of FIG. 17, a second piezoelectric layer 906b is deposited over the first electrode layer 107. Because of the substantially low surface roughness of the protected top surface portions 107f of the first electrode layer 107, the second piezoelectric layer 906b has a crystal structure with few defects, thereby increasing the reliability of the piezoelectric effect in the second piezoelectric layer 906b. In some embodiments, the second piezoelectric layer 906b comprises the same material as the first piezoelectric layer 906a. The second piezoelectric layer 906b fills in the opening 1507 of the first electrode layer 107 (see FIG. 16) and, in some embodiments, may also cover outermost sidewalls 1407 of the first electrode layer 107. In some embodiments, the second piezoelectric layer 906b is thicker than the first piezoelectric layer 906a. The second piezoelectric layer 906b may have a thickness in a range of between approximately 100 nanometers and approximately 1000 nanometers. On top of the second piezoelectric layer 906b, a second electrode layer 108 is deposited. In some embodiments, the second electrode layer 108 comprises the same material as the first electrode layer 107 and/or has a same thickness as the first electrode layer 107. Further, the second electrode layer 108, in some embodiments, has the same substantially low surface roughness as the protected top surface portions 107f of the first electrode layer 107.

Figure 18A:
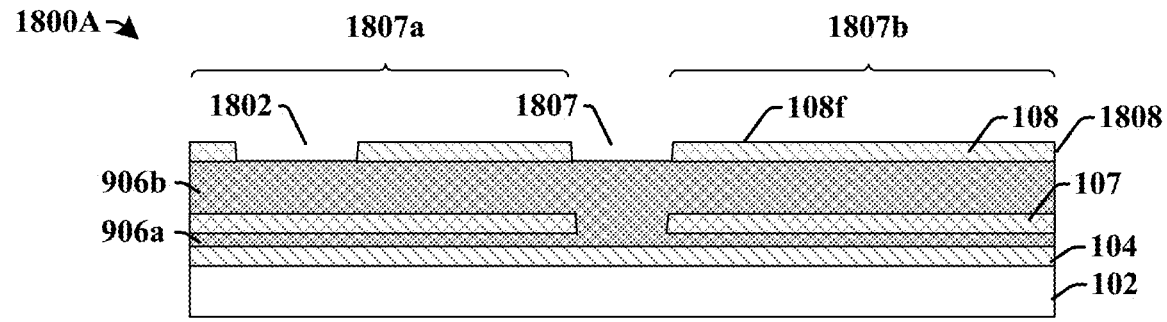

As shown in the cross-sectional view 1800A of FIG. 18A, the second electrode layer 108 of FIG. 17 is patterned according to some embodiments. The second electrode layer 108 may, for example, be patterned using the same steps as shown in FIGS. 10-16. The second electrode layer 108 defines an opening 1807 in the center of the second electrode layer 108 that substantially aligns with the opening 1507 in the first electrode layer 107, illustrated in FIG. 15. In some embodiments, an additional opening 1802 is also formed in the second electrode layer 108 on a first side 1807a of the opening 1807. The opening 1807 and the additional opening 1802 of the second electrode layer 108 may be formed simultaneously during the same patterning steps. In some embodiments, notwithstanding that the second electrode layer 108 appears to have three discrete segments in cross section, the three discrete segments may be continuous (and hence electrically coupled) with each other when viewed top down. In some embodiments (not shown), outermost sidewalls 1808 of the second electrode layer 108 may have a higher surface roughness than protected top surface portions 108f of the second electrode layer 108. The protected top surface portions 108f of the second electrode layer 108, in some embodiments, has the same substantially low surface roughness as the protected top surface portions 107f of the first electrode layer 107. Thus, both the second electrode layer 108 and the first electrode layer 107 have substantially uniform sheet resistances, in a range of between approximately 1 Ohm per square and approximately 120 Ohms per square.

Figure 18B:
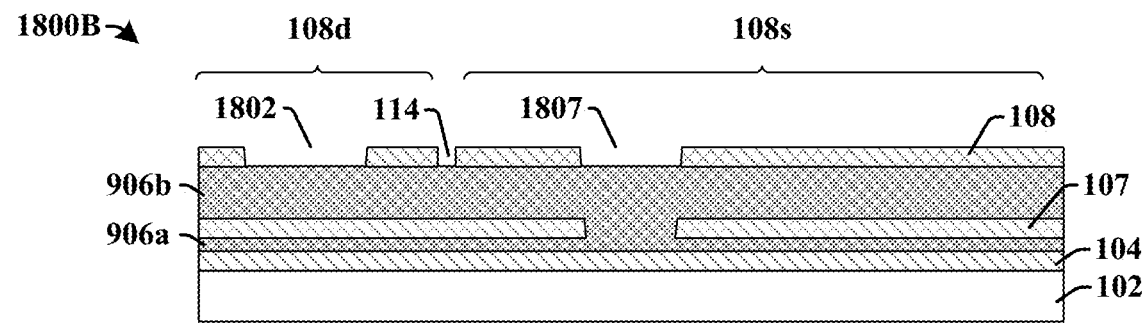

As shown in the cross-sectional view 1800B of FIG. 18B, the second electrode layer 108 is patterned according to other embodiments, such that the second electrode layer 108 defines a discontinuity 114. The second electrode layer 108 defines a same opening 1807 and additional opening 1802 as the second electrode layer 108 of FIG. 18A. The discontinuity 114, in some embodiments, is formed between the opening 1807 and the additional opening 1802, and is formed simultaneously with the opening 1807 and the additional opening 1802. The discontinuity 114 provides electrical isolation between contacts, as shown in the embodiments illustrated in FIGS. 1-3, for example. The discontinuity 114 separates the second electrode layer 108 into a dummy segment 108d and a sensing segment 108s, in some embodiments.

Figure 19:
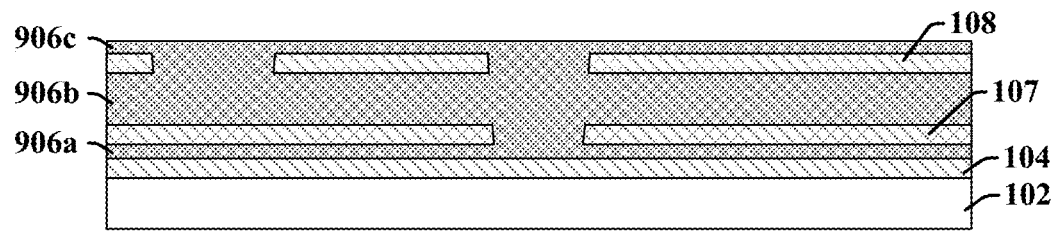

As shown in the cross-sectional view 1900 of FIG. 19, a third piezoelectric layer 906c is deposited over the second electrode layer 108 of FIG. 18A, in some embodiments. In alternative embodiments, the third piezoelectric layer 906c is deposited over the second electrode layer 108 of FIG. 18B and then the method proceeds to the acts at FIG. 20 and from the acts at FIG. 20 to the acts at FIGS. 23-29 (skipping the acts at FIGS. 21 and 22). In some embodiments, the third piezoelectric layer 906c comprises the same material as the first and second piezoelectric layers 906a, 906b. The third piezoelectric layer 906c fills the opening 1807 and the additional opening 1802 of the second electrode layer 108 of FIG. 18A. The third piezoelectric layer 906c also covers top surfaces of the second electrode layer 108, in some embodiments. In some embodiments, the third piezoelectric layer 906c has a thickness that is less than the thickness of the second piezoelectric layer 906b. Because of the substantially low surface roughness of the protected top surface portions 108f of the second electrode layer 108, the third piezoelectric layer 906c has a crystal structure with few defects, thereby increasing the reliability of the piezoelectric effect in the third piezoelectric layer 906c.

Figure 20:
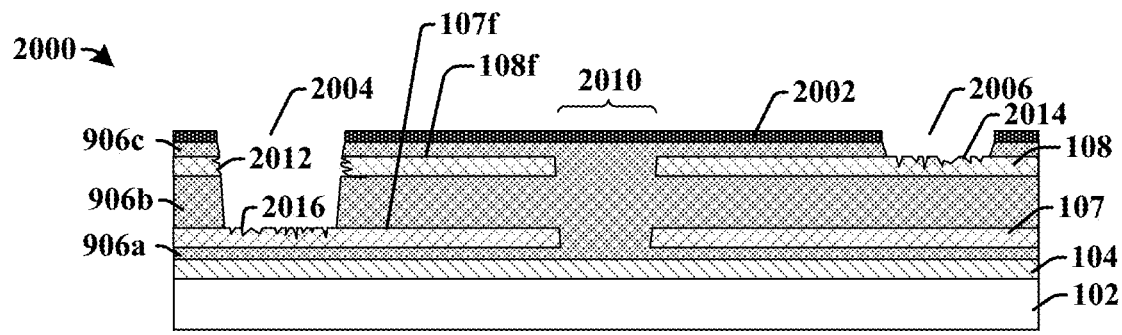

As shown in the cross-sectional view 2000 of FIG. 20, a mask layer 2002 is deposited over the third piezoelectric layer 906c. The mask layer 2002 may comprise a dielectric such as an oxide or nitride, or the like, or a photosensitive material (e.g., a photoresist). The mask layer 2002 is patterned using photolithography and etching (e.g., wet etch or dry etch) to form a first opening 2004 and a second opening 2006. The second piezoelectric layer 906b and the third piezoelectric layer 906c are patterned according to the first and second openings 2004, 2006 in the mask layer 2002 to form the first and second openings 2004, 2006 in the second piezoelectric layer 906b and the third piezoelectric layer 906c. In some embodiments, forming the first and second openings 2004, 2006 in the second and third piezoelectric layers 906b, 906c may be conducted using a same etch step with the first and second electrode layers 107, 108 serving as etch stops. The first opening 2004 exposes a top surface of the first electrode layer 107. The second opening 2006 exposes a top surface of the second electrode layer 108. In other embodiments, multiple photolithography and etch steps may be conducted to form the first and second openings 2004, 2006 in the second and third piezoelectric layers 906b, 906c. In some embodiments, a center region 2010 of the piezoelectric layers 906a-c remains in-tact and covered by the mask layer 2002. In other embodiments, a center region 2010 of the piezoelectric layers 906a-c is removed by etching.

In some embodiments, a photoresist is used to pattern the mask layer 2002 and is subsequently removed after the formation of the first opening 2004 and the second opening 2006. The photoresist may be removed using oxygen plasma ashing, and then an Ar-sputter process may be used for cleaning. Thus, in some embodiments, exposed surfaces of the first electrode layer 107 and the second electrode layer 108 in the first opening 2004 and the second opening 2006 may oxidize during the photoresist removal. In some embodiments, these exposed surfaces may include inner sidewalls 2012 of the second electrode layer 108, an upper exposed surface 2014 of the second electrode layer 108, and/or upper exposed surface 2016 of the first electrode layer. Consequently, after the Ar-sputter process, the exposed surfaces of the first electrode layer 107 and the second electrode layer 108 may each have a surface roughness that is greater than top surfaces of the protected top surface portions 107f of the first electrode layer 107 and the protected top surface portions 108f of the second electrode layer 108. In alternative embodiments, different processing steps (such as steps similar to FIGS. 10-16, for example) may be conducted to protect the first electrode layer 107 and the second electrode layer 108 from oxygen plasma ashing, and thereby mitigate changes in surface roughness of on the first electrode layer 107 and the second electrode layer 108.

Figure 21:
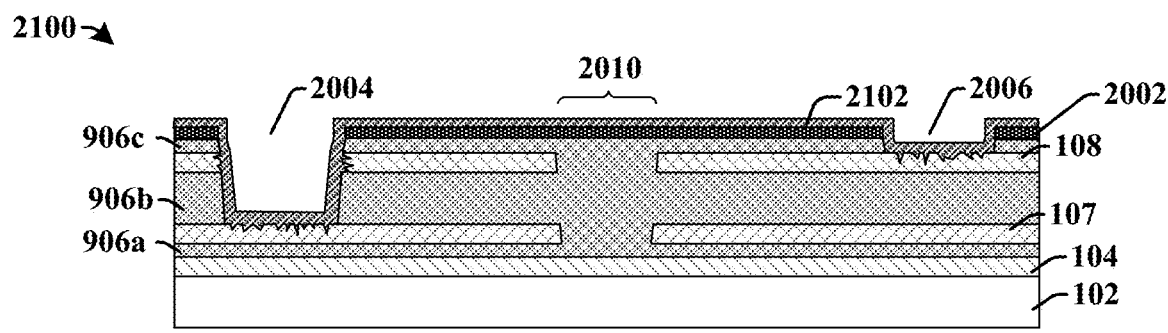

As shown in the cross-sectional view 2100 of FIG. 21, a conformal dielectric liner layer 2102 is deposited over the mask layer 2002 in some embodiments. The conformal dielectric liner layer 2102 covers sidewalls and bottom surfaces of the first and second openings 2004, 2006. In some embodiments, the conformal dielectric liner layer 2102 may be deposited by a deposition technique (e.g., PVD, CVD, PE-CVD, ALD, sputtering, etc.). The conformal dielectric liner layer 2102 may comprise a dielectric material such as a nitride (e.g., silicon nitride), an oxide (e.g., silicon oxide), a carbide (e.g., silicon carbide), or the like.

Figure 22:
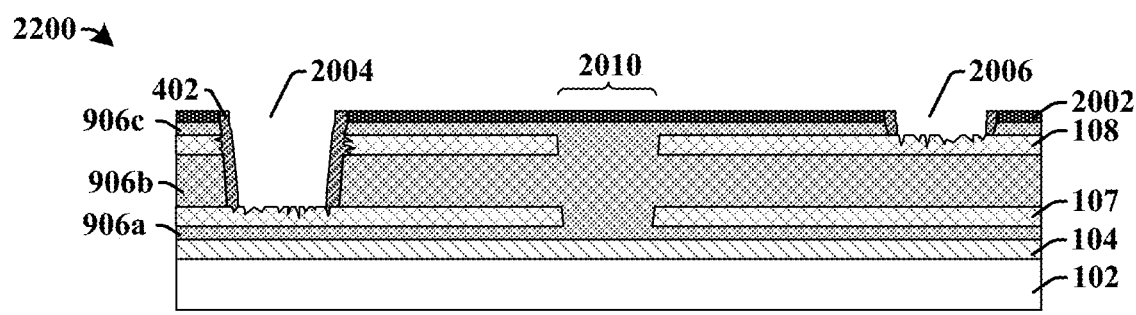

As shown in the cross-sectional view 2200 of FIG. 22, a vertical etching process (e.g., an etch back process) is conducted to remove horizontal portions of the conformal dielectric liner layer 2102 of FIG. 21. In some embodiments, the vertical etching process utilizes a dry etch. After the vertical etching process is complete, a dielectric liner 402 remains. The dielectric liner 402 covers inner sidewalls of the first opening 2004. In some embodiments, the dielectric liner 402 also covers inner sidewalls of the second opening 2006. In the first opening 2004, the dielectric liner 402 directly contacts the second piezoelectric layer 906b and the third piezoelectric layer 906c. The dielectric liner 402 also completely covers sidewalls of the second electrode layer 108 in the first opening 2004. A top surface of the first electrode layer 107 is left uncovered in the first opening 2004. In some embodiments, in the second opening 2006, the dielectric liner 402 directly contacts the third piezoelectric layer 906c. A top surface of the second electrode layer 108 is left uncovered in the second opening 2006.

Figure 23:
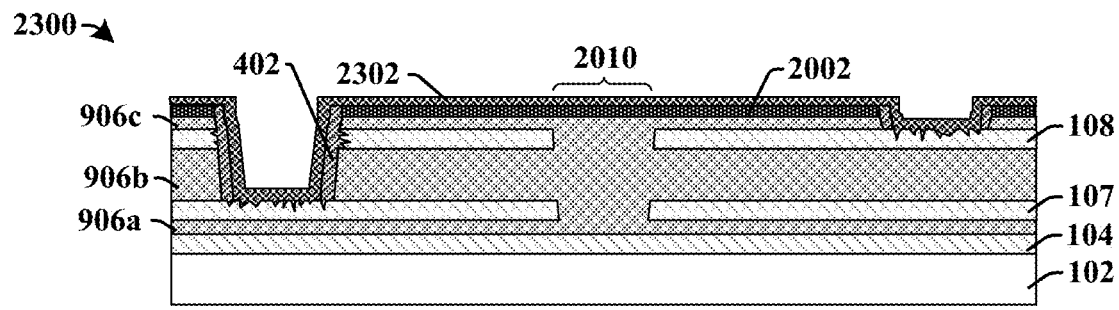

As shown in the cross-sectional view 2300 of FIG. 23, a conductive layer 2302 is deposited over the mask layer 2002. The conductive layer 2302 directly contacts the first electrode layer 107 and the second electrode layer 108. In some embodiments, the conductive layer 2302 comprises a conductive material such as aluminum, copper, or the like.

Figure 24:
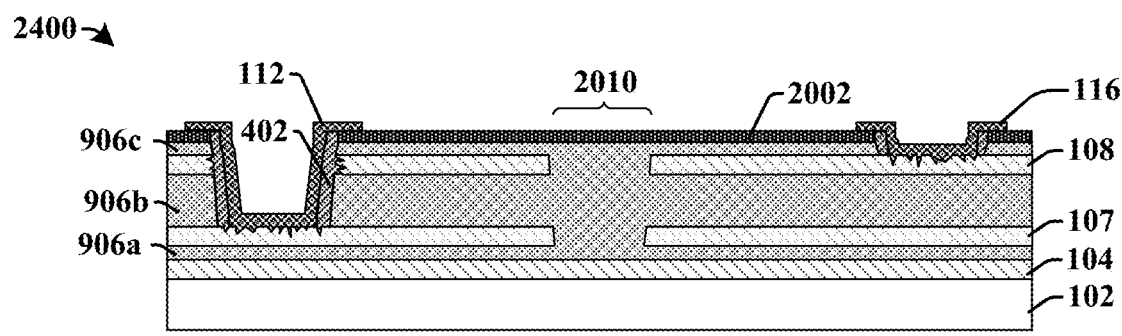

As shown in the cross-sectional view 2400 of FIG. 24, the conductive layer 2302 of FIG. 23 is patterned (i.e., select portions of the conductive layer 2302 are removed) to form a first contact 112 that is isolated from a second contact 116. The conductive layer 2302 may be removed by a selective etch. In some embodiments, the mask layer 2002 is unaffected by the selective etch that forms the first and second contacts 112, 116. In some embodiments, the dielectric liner 402 separates the first contact 112 from the second and third piezoelectric layers 906b, 906c. In some embodiments, the dielectric liner 402 also separates the second contact 116 from the third piezoelectric layer 906c.

Figure 25:
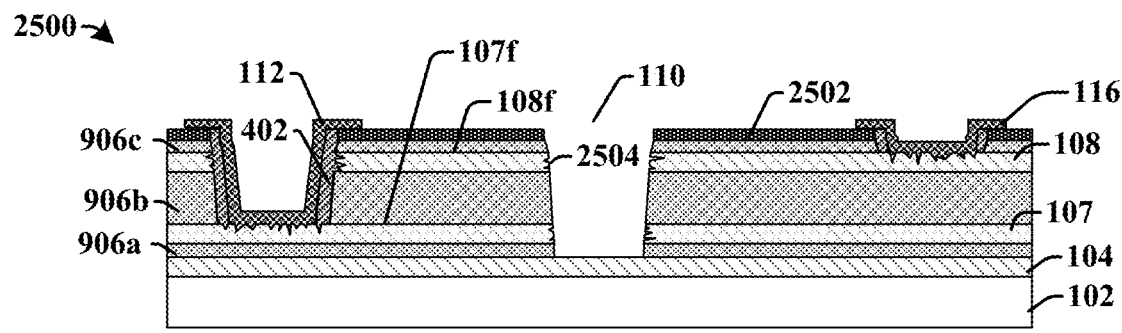

As shown in the cross-sectional view 2500 of FIG. 25, the mask layer 2002 of FIG. 24 is further patterned using photolithography and etching, such that a patterned mask layer 2502 is used to form a cavity 110 by etching. The cavity 110 is formed by removing the center region 2010 of the piezoelectric layers 906a-c (see FIG. 24). In some embodiments, the etch that forms the cavity 110 is selective to the piezoelectric layers 906a-906c and does not affect the first and second electrode layers 107, 108. However, inner sidewalls 2504 of the first and second electrode layers 107, 108 may, for example, be exposed upon formation of the cavity 110.

In some embodiments, a photoresist is used to form the cavity 110. Thus, in some embodiments, if the photoresist is removed using oxygen plasma etching when the inner cavity sidewalls 2504 of the first and second electrode layers 107, 108 are exposed, the inner sidewalls 2504 of the first and second electrode layers 107, 108 may oxidize. In some embodiments, an Ar-sputter process is used for cleaning, and the inner cavity sidewalls 2504 of the first and second electrode layers 107, 108 may have a surface roughness that is higher than the surface roughness of top surfaces of the protected top surface portions 107f of the first electrode layer 107 and the protected top surface portions 108f of the second electrode layer 108. In alternative embodiments, different processing steps (such as steps similar to FIGS. 10-16, for example) may be conducted to protect inner cavity sidewalls 2504 of the first electrode layer 107 and the second electrode layer 108 from oxygen plasma ashing. In some embodiments, the cavity 110 has a width that is in a range of between approximately 1 micrometer and approximately 5 micrometers.

Figure 26:
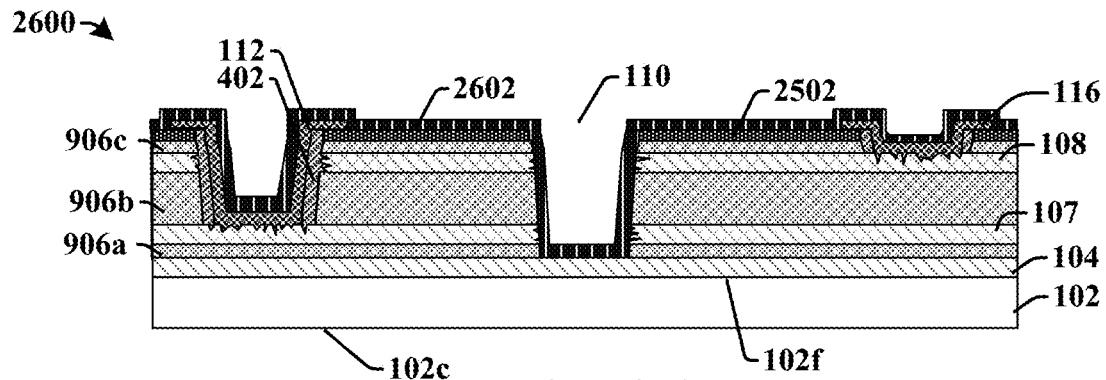

As shown in the cross-sectional view 2600 of FIG. 26, a protective dielectric layer 2602 is deposited over a front side 102f of the substrate 102, such that the protective dielectric layer 2602 covers top surfaces of the patterned mask layer 2502, the first contact 112, the second contact 116 and the cavity 110. The protective dielectric layer 2602 may comprise an oxide, nitride, carbide, or the like.

Figure 27:
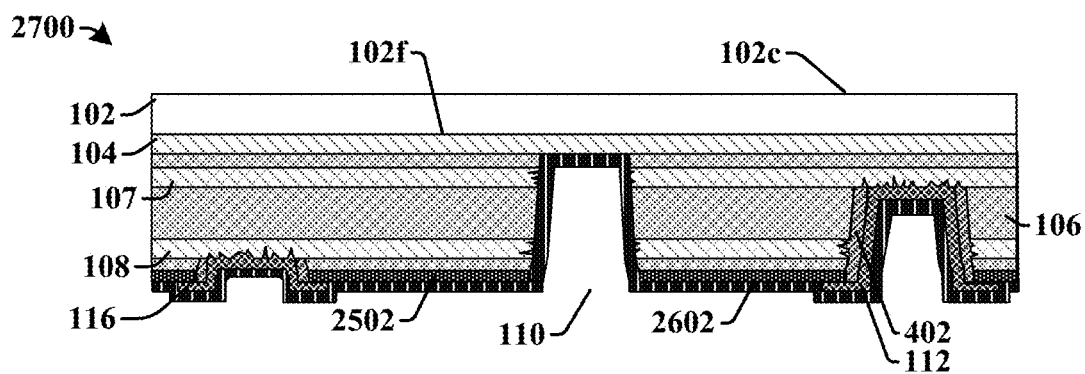

As shown in the cross-sectional view 2700 of FIG. 27, the embodiment in the cross-sectional view 2600 is flipped over such that the backside 102c of the substrate 102 of FIG. 26 can be patterned. In some embodiments, the backside 102c of the substrate 102 is ground down to thin the substrate 102. In some embodiments, a planarization process (e.g., a chemical mechanical planarization process) may be conducted to thin the substrate 102. In FIG. 27, the first, second and third piezoelectric layers 906a-906c of FIG. 26 are together represented by a piezoelectric structure 106.

Figure 28:
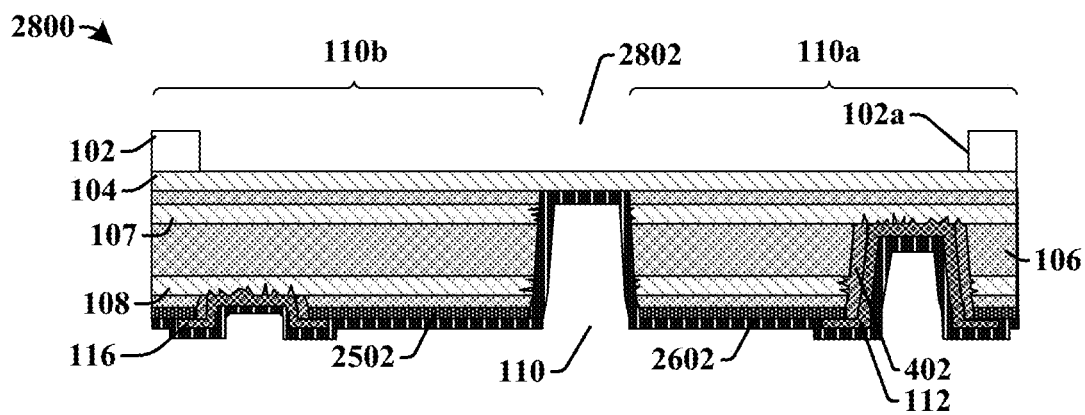

As shown in the cross-sectional view 2800 of FIG. 28, the substrate 102 of FIG. 27 is patterned. An additional cavity 2802 is formed within the substrate 102 and has outer sidewalls defined by a pair of inner sidewalls 102a of the substrate 102. In some embodiments, the substrate 102 is patterned to form the additional cavity 2802 by using a dry etch that stops at the backside dielectric layer 104. The substrate 102 supports peripheral portions of the piezoelectric structure 106 on a first side 110a of the cavity 110 and on a second side 110b of the cavity 110.

Figure 29:
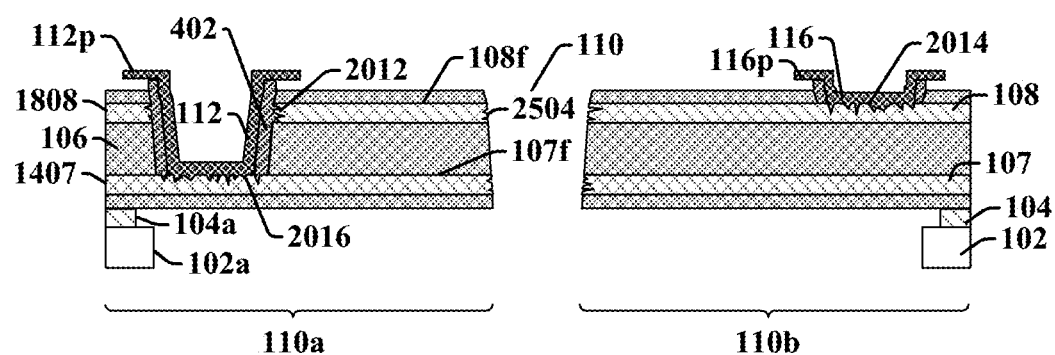

As shown in the cross-sectional view 2900 of FIG. 29, the embodiment in the cross-sectional view 2800 is flipped over, and the patterned mask layer 2502, the protective dielectric layer 2602, and portions of the front side dielectric layer 104 of FIG. 28 are removed to form an embodiment of a piezoMEMS microphone. In some embodiments, the patterned mask layer 2502, the protective dielectric layer 2602 and portions of the front side dielectric layer 104 are removed using a vapor hydrofluoric dry etch. The cavity 110 fully extends through the piezoelectric structure 106 from the cross-sectional view 2900. The front side dielectric layer 104 remains at peripheral portions of the first side 110a of the cavity 110 and the second side 110b of the cavity 110 and between the substrate 102 and a bottom surface of the piezoelectric structure 106. In some embodiments, because of the vapor hydrofluoric dry etch, inner sidewalls 104a of the front side dielectric layer 104 are laterally offset from inner sidewalls 102a of the substrate 102. In some embodiments, the lengths of the piezoelectric structure 106 on the first side 110a of the cavity 110 and on the second side 110b of the cavity are substantially equal and are each in a range of between approximately 300 micrometers and approximately 600 micrometers. In some embodiments, outermost sidewalls of the piezoelectric structure 106, the first electrode layer 107, the second electrode layer 108, the front side dielectric layer 104, and the substrate 102 are substantially aligned. Further, in some embodiments, peripheral portions 112p of the first contact 112 and peripheral portions 116p of the second contact 116 have bottommost surfaces that are spaced apart from the piezoelectric structure 106 because of the patterned mask layer 2502 used in the method of forming this piezoMEMS microphone. In some embodiments, the outermost sidewalls 1407 of the first electrode layer 107 and the outermost sidewalls 1808 of the second electrode layer 108 may each have a higher surface roughness than the protected top surface portions 107f of the first electrode layer 107 and the protected top surface portions 108f of the second electrode layer 108. In some embodiments, inner sidewalls 2012 of the second electrode layer 108, an upper exposed surface 2014 of the second electrode layer 108, upper exposed surface 2016, and/or inner cavity sidewalls 2504 of the first and second electrode layers 107, 108 may each have a higher surface roughness than the protected top surface portions 107f of the first electrode layer 107 and the protected top surface portions 108f of the second electrode layer 108.

Figure 30:
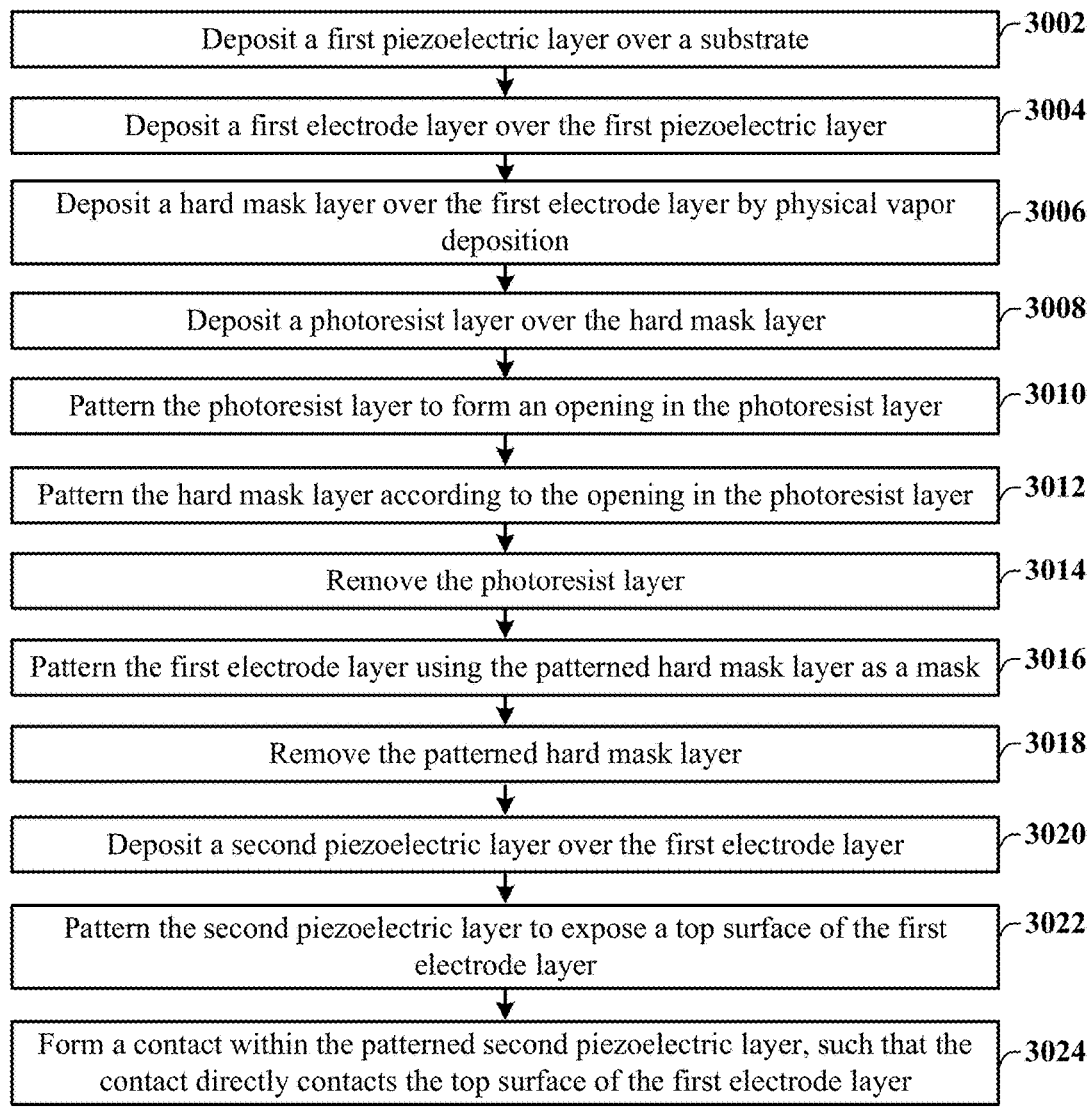
FIG. 30 illustrates a flow diagram of some embodiments of the method of FIGS. 9-29.

FIG. 30 illustrates a flow diagram of some embodiments of a method 3000 of forming a piezoMEMS microphone having electrodes with substantially uniform sheet resistances throughout their lengths.

While method 3000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 3002, a first piezoelectric layer is deposited over a substrate.

At 3004, a first electrode layer is deposited over the first piezoelectric layer. FIG. 9 illustrates a cross-sectional view 900 of some embodiments corresponding to acts 3002 and 3004.

At 3006, a hard mask layer is deposited over the first electrode layer by physical vapor deposition. FIG. 10 illustrates a cross-sectional view 1000 of some embodiments corresponding to act 3006.

At 3008, a photoresist layer is deposited over the hard mask layer. FIG. 11 illustrates a cross-sectional view 1100 of some embodiments corresponding to act 3008.

At 3010, the photoresist layer is patterned to form an opening in the photoresist layer. FIG. 12 illustrates a cross-sectional view 1200 of some embodiments corresponding to act 3010.

At 3012, the hard mask layer is patterned according to the opening in the photoresist layer. FIG. 13 illustrates a cross-sectional view 1300 of some embodiments corresponding to act 3012.

At 3014, the photoresist layer is removed. FIG. 14 illustrates a cross-sectional view 1400 of some embodiments corresponding to act 3014.

At 3016, the first electrode layer is patterned using the patterned hard mask layer as a mask. FIG. 15 illustrates a cross-sectional view 1500 of some embodiments corresponding to act 3016.

At 3018, the patterned hard mask layer is removed. FIG. 16 illustrates a cross-sectional view 1600 of some embodiments corresponding to act 3018.

At 3020, a second piezoelectric layer is deposited over the first electrode layer. FIG. 19 illustrates a cross-sectional view 1900 of some embodiments corresponding to act 3020.

At 3022, the second piezoelectric layer is patterned to expose a top surface of the first electrode layer. FIG. 20 illustrates a cross-sectional view 2000 of some embodiments corresponding to act 3022.

At 3024, a contact is formed within the patterned second piezoelectric layer such that the contact directly contacts the top surface of the first electrode layer. FIGS. 23-24 illustrate cross-sectional views 2300 and 2400 of some embodiments corresponding to act 3024.

Therefore, the present disclosure relates to a new method of manufacturing a piezoMEMS device to protect the electrode layers from oxidation during patterning.

Accordingly, in some embodiments, the present disclosure relates to a method for forming a microelectromechanical system (MEMS) device, comprising: depositing a first electrode layer over a first piezoelectric layer; depositing a hard mask layer over the first electrode layer; forming a photoresist mask on the hard mask layer and with a first-electrode pattern; performing a first etch into the hard mask layer with the photoresist mask in place to transfer the first-electrode pattern to the hard mask layer; removing the photoresist mask; performing a second etch into the first electrode layer with the hard mask layer in place to transfer the first-electrode pattern to the first electrode layer; and removing the hard mask layer.

In other embodiments, the present disclosure relates to a method of forming a piezomicroelectromechanical system (piezoMEMS) device, comprising: depositing a first piezoelectric layer over a front side of a substrate; depositing a first electrode layer over the first piezoelectric layer; depositing a first dielectric layer over the first electrode layer; patterning the first dielectric layer using a first photoresist mask and to form an opening in the first dielectric layer that exposes a portion of the first electrode layer; performing a first etch into the first electrode layer through the first dielectric layer to remove the portion of the first electrode layer exposed by the opening; and removing the first dielectric layer.

In yet other embodiments, the present disclosure relates to a piezomicroelectromechanical system (piezoMEMS) device, comprising: a piezoelectric structure; a first electrode layer and a second electrode layer embedded in the piezoelectric structure, wherein the second electrode layer overlies and is spaced from the first electrode layer, wherein the second electrode layer has an electrode sidewall that has a higher average surface roughness than a top surface of the second electrode layer; a first contact overlying and extending through the piezoelectric structure to the first electrode layer, wherein the first contact borders the electrode sidewall; and a second contact overlying and extending through the piezoelectric structure to the second electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a microelectromechanical system (MEMS) device, comprising:
    depositing a first electrode layer over a first piezoelectric layer;
    depositing a hard mask layer over the first electrode layer;
    forming a photoresist mask on the hard mask layer and with a first-electrode pattern;
    performing a first etch into the hard mask layer with the photoresist mask in place to transfer the first-electrode pattern to the hard mask layer;
    removing the photoresist mask;
    performing a second etch into the first electrode layer with the hard mask layer in place to transfer the first-electrode pattern to the first electrode layer;
    removing the hard mask layer;
    depositing a second piezoelectric layer on the first electrode layer;
    depositing a second electrode layer on the second piezoelectric layer;
    performing an etch through the second electrode layer and the second piezoelectric layer to form an opening exposing the first electrode layer and a sidewall of the second electrode layer;
    depositing a dielectric liner layer covering the first and second electrode layers and further lining the opening;
    etching back the dielectric liner layer to expose the first electrode layer; and
    forming a conductive contact in the opening, wherein the conductive contact is electrically coupled to the first electrode layer and is electrically isolated from the sidewall of the second electrode layer by the dielectric liner layer.

2. The method of claim 1, wherein the deposition of the first electrode layer and the deposition of the hard mask layer are at the same process tool.

3. The method of claim 1, wherein the hard mask layer is deposited using physical vapor deposition.

4. The method of claim 1, wherein the photoresist mask is removed using an oxygen plasma ashing.

5. The method of claim 1, wherein the removing of the photoresist mask comprises oxidizing portions of the first electrode layer uncovered by the hard mask layer.

6. The method of claim 1, further comprising:
    forming a third piezoelectric layer on the second electrode layer; and
    forming an additional conductive contact extending through the third piezoelectric layer to the second electrode layer.

7. A method of forming a piezomicroelectromechanical system (piezoMEMS) device, comprising:
    depositing a first piezoelectric layer over a front side of a substrate;
    depositing a first electrode layer over the first piezoelectric layer;
    depositing a first dielectric layer over the first electrode layer;
    patterning the first dielectric layer using a first photoresist mask and to form an opening in the first dielectric layer that exposes a portion of the first electrode layer;
    performing a first etch into the first electrode layer through the first dielectric layer to remove the portion of the first electrode layer exposed by the opening;
    removing the first dielectric layer;
    depositing a second piezoelectric layer on the first electrode layer;
    depositing a second electrode layer on the second piezoelectric layer;
    patterning the second electrode layer to form a sensing-electrode segment and a dummy-electrode segment, wherein the sensing- and dummy-electrode segments are electrically separate;
    performing a second etch through the dummy-electrode segment and the second piezoelectric layer to form an opening exposing the first electrode layer and a sidewall of the dummy-electrode segment; and
    forming a conductive contact in the opening, wherein the conductive contact is electrically coupled to the first electrode layer and the dummy-electrode segment.

8. The method according to claim 7, further comprising:
    patterning the first and second piezoelectric layers to form a first cavity extending through the first and second piezoelectric layers.

9. The method of claim 8, further comprising:
    depositing a passivation layer over the second electrode layer and lining the first cavity;
    thinning a back side of the substrate;
    patterning the substrate from the back side of the substrate to form a second cavity aligned with the first cavity; and
    performing a third etch to remove the passivation layer.

10. The method of claim 9, further comprising:
    depositing a second dielectric layer on the front side of the substrate, wherein the first piezoelectric layer is deposited on the second dielectric layer, wherein the first cavity extends to the second dielectric layer, and wherein the third etch removes a portion of the second dielectric layer in the first cavity.

11. The method of claim 7, wherein the first dielectric layer is deposited by physical vapor deposition and is removed by an argon sputtering.

12. The method of claim 7, further comprising:
removing the first photoresist mask after patterning the first dielectric layer and before performing the first etch.

13. The method of claim 12, wherein the first photoresist mask is removed by oxygen plasma ashing.

14. A method of forming a piezomicroelectromechanical system (piezoMEMS) device, comprising:
forming a dielectric layer over a substrate;
depositing a first piezoelectric layer over the substrate after forming the dielectric layer over the substrate, wherein the first piezoelectric layer directly contacts the dielectric layer;
depositing a first electrode layer over the first piezoelectric layer;
depositing a hard mask layer over the first electrode layer;
depositing a photoresist layer over the hard mask layer;
patterning the photoresist layer to form an opening in the photoresist layer;
patterning the hard mask layer according to the opening in the photoresist layer;
removing the photoresist layer;
patterning the first electrode layer using the patterned hard mask layer as a mask structure;
removing the patterned hard mask layer;
depositing a second piezoelectric layer over the first electrode layer;
depositing a second electrode layer over the second piezoelectric layer;
patterning the second piezoelectric layer and the second electrode layer to expose a top surface of the first electrode layer;
forming a first contact extending through the patterned second piezoelectric layer and the second electrode layer, wherein the first contact directly contacts the top surface of the first electrode layer; and
forming a second contact over and electrically coupled to the second electrode layer, wherein the second contact is electrically isolated from the first contact.

15. The method of claim 14, further comprising:
depositing a conformal dielectric liner layer over the patterned second piezoelectric layer and the second electrode layer and contacting the top surface of the first electrode layer; and
performing a vertical etching process to remove horizontal portions of the conformal dielectric liner layer to form a dielectric liner covering inner sidewalls of the patterned second piezoelectric layer and the second electrode layer, wherein the forming of the first and second contacts are conducted after the dielectric liner is formed.

16. The method of claim 14, wherein the top surface of the first electrode layer has a first average surface roughness, wherein other top surfaces of the first electrode layer that are covered by the patterned second piezoelectric layer have a second average surface roughness less than the first average surface roughness.

17. The method of claim 14, further comprising:
depositing a passivation layer over the second piezoelectric layer and the first and second contacts;
thinning a back side of the substrate;
removing portions of the substrate from the back side of the substrate to form a cavity; and
removing the passivation layer.

18. The method of claim 14, wherein the photoresist layer is removed by oxygen plasma ashing, and wherein the patterned hard mask layer is removed by argon sputtering.

19. The method of claim 14, wherein the first contact is electrically isolated from the second electrode layer.

20. The method of claim 17, further comprising:
removing portions of the dielectric layer such that remaining portions of the dielectric layer are arranged between the substrate and the first piezoelectric layer.

* * * * *